United States Patent [19]

Shinada

[11] Patent Number: 4,945,315
[45] Date of Patent: Jul. 31, 1990

[54] METHOD OF AND APPARATAUS FOR PROJECTING A LASER BEAM INTO LIGHT AMPLIFIER

[75] Inventor: Hidetoshi Shinada, Kanagawa, Japan

[73] Assignee: Fuji Photo Film Co., Ltd., Kanagawa, Japan

[21] Appl. No.: 263,767

[22] Filed: Oct. 28, 1988

[30] Foreign Application Priority Data

Oct. 28, 1987 [JP] Japan .................................. 62-272713

[51] Int. Cl.$^5$ .............................................. H01S 3/00
[52] U.S. Cl. ................................. 330/4.3; 350/96.15
[58] Field of Search .......................... 330/4.3; 372/19; 350/96.13, 96.15

[56] References Cited

U.S. PATENT DOCUMENTS

| | | | |
|---|---|---|---|
| 3,525,053 | 8/1970 | Chernoch | 330/4.3 |
| 3,621,459 | 11/1971 | Reeves | 330/4.3 |
| 3,704,427 | 11/1972 | Heywang | 330/4.3 |
| 4,655,528 | 5/1987 | Chinone et al. | 372/19 X |
| 4,785,462 | 11/1988 | Keil | 372/19 X |
| 4,787,086 | 11/1988 | Dental et al. | 372/19 |
| 4,803,686 | 2/1989 | Brock | 330/4.3 |

OTHER PUBLICATIONS

Macomber et al., "Semiconductor Laser Power Amplifier", SPIE, vol. 723, 1986.

*Primary Examiner*—Thomas H. Tarcza
*Assistant Examiner*—Mark Hellner
*Attorney, Agent, or Firm*—Sughrue, Mion, Zinn, Macpeak & Seas

[57] ABSTRACT

A method of and an apparatus for projecting an incident laser beam into a broad contact-type light amplifier. The laser beam is projected after the intensity distribution of the laser beam is made to coincide with the electromagnetic field distribution in the fundamental mode of the light amplifier. Since only the fundamental mode is used as the propagation mode of the light amplifier, a Gaussian beam amplified by the light amplifier is emitted. Consequently, the laser beam emitted from the light amplifier can be made into a several-micron spot by condensing the laser beam to a diffraction limit.

7 Claims, 4 Drawing Sheets

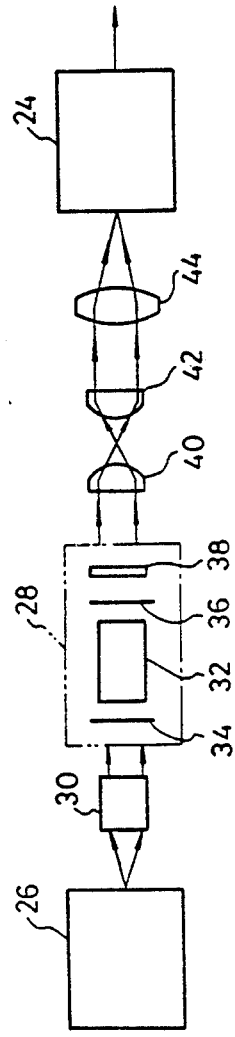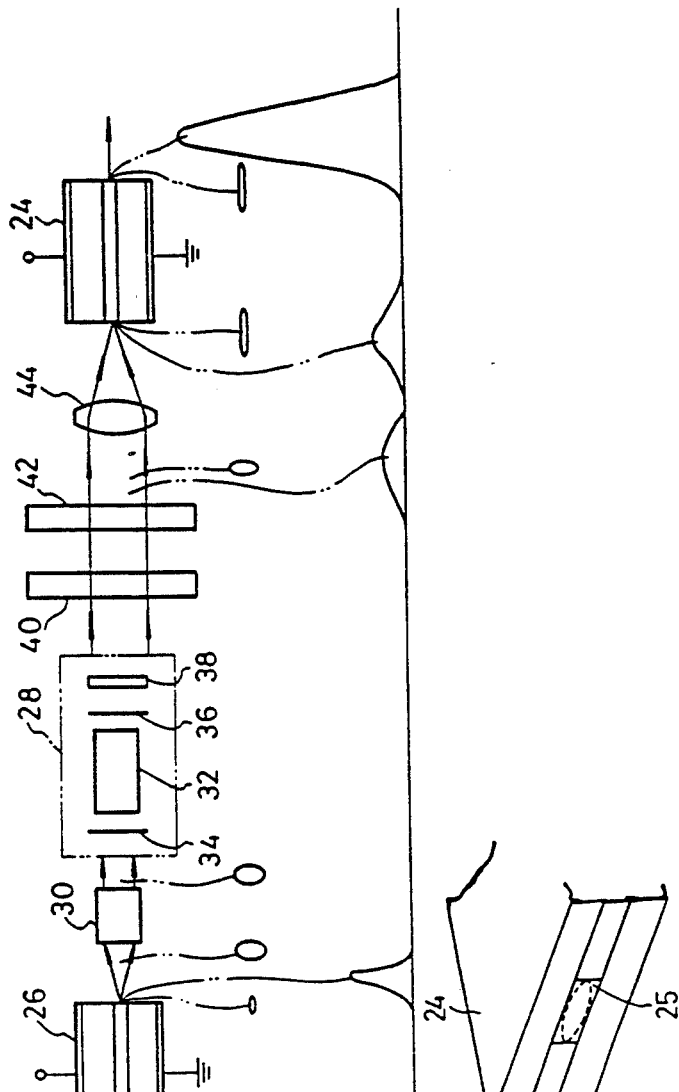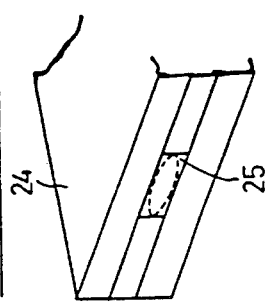
FIG. 1 (A)
FIG. 1 (B)
FIG. 1 (C)

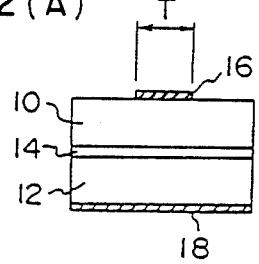
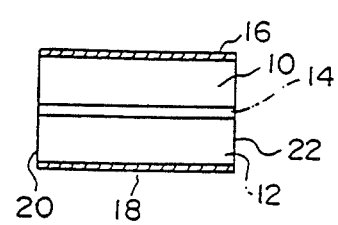

METHOD OF AND APPARATAUS FOR PROJECTING A LASER BEAM INTO LIGHT AMPLIFIER

BACKGROUND OF THE INVENTION

1. Field of the Invention

The present invention relates to a method of and an apparatus for projecting a laser beam into a light amplifier and, more particularly, to a method of and an apparatus for projecting a laser beam into a light amplifier of a so-called broad contact type in which a stripe width of an active region is equal to or greater than a predetermined value.

2. Description of the Related Art

Recently, an examination has been conducted on the use of a laser diode as a light amplifier after making the mirror surfaces of the laser diode non-reflecting. As shown in FIGS. 2(A) and 2(B), the light amplifier is arranged such that an active region 14 is held between a n-type semiconductor region 10 and a p-type semiconductor region 12, and an anode 16 with a stripe width T is provided on the n-type semiconductor region 10, while a cathode 18 is provided on the p-type semiconductor region 12. In addition, mirror surfaces 20, 22 are coated so as to be non-reflective. A laser beam generated by a laser diode 26 is projected into the light amplifier 24 via a collimator 27, a light isolator 28 and a condenser 29, as shown in FIG. 3. If a bias is applied to this light amplifier in the forward direction, a positive hole and an electron flow, and luminescence and recoupling take place in the active region 14. In this state, when incident ray Pin is projected into the active region 14 from a mirror surface 20 side, amplified emission ray Pout is emitted from a mirror surface 22 side. In other words, although the semiconductor absorbs the incident ray Pin in the normal state of thermal equilibrium, when an injector amount of the positive hole and electron is large, and energy distribution of the positive hole and electron in the active region 14 becomes a state of so-called inverted distribution, the incident ray is not absorbed and is amplified while being propagated through a light waveguide region of the active region 14, and the ray is then emitted in the form of emission ray Pout through stimulated emission. At that time, a horizontal transverse mode which is parallel with the active region 14 is controlled by a gain waveguide mechanism or a refractive index waveguide mechanism. The gain waveguide mechanism makes use of a phenomenon in which, when there is no refractive index distribution, light is amplified by stimulated emission along a portion where the gain is high. Specifically, the light is confined in a region where the gain is high, and this region serves as a waveguide region. Meanwhile, the refractive index waveguide mechanism makes use of a phenomenon in which light is reflected in a boundary where a difference in the refractive index exists, a high refractive index portion is provided in the active region, and the high refractive index portion serves as a waveguide region. When light is introduced into the waveguide region, total reflection occurs repeatedly on the boundary surface of the high refractive index portion and is propagated. A normalized frequency V of the above-described light amplifier and a refractive index B of a normalized waveguide region, which shows a degree of confinement of light, have relationships shown in FIG. 4. It should be noted that a mark M in the drawing denotes a degree of the horizontal transverse mode. As can be understood from FIG. 4, the higher the normalized frequency V, the more the light propagated through the guiding region becomes a multimode.

In the case of a broad contact type of a light amplifier in which the width of the waveguide region, hence, the stripe width, is equal to or greater than a predetermined value (10 $\mu$m), it is possible to obtain a high output laser beam of several hundred milli watts to one watt. However, there is a problem in that, since a restriction in a lateral transverse direction is alleviated due to the large stripe width and the horizontal transverse mode has become a multi-mode (see FIG. 3), it is impossible to allow the light to converge into a spot of several microns depending on an optical system. In other words, if consideration is given to a light amplifier or a refractive index waveguide type amplifier which makes use of the refractive index waveguide mechanism, the normalized frequency V is expressed by the following formula (1), so that, if the stripe width T becomes large, the normalized frequency V becomes high. Consequently, as can be seen from FIG. 4, the laser beam propagated through the waveguide region assumes a multi-mode, so that it becomes impossible to allow the laser beam to converge up to a diffraction limit in the Gaussian distribution:

$$V = k_0 T \sqrt{n_1^2 - n_2^2} \qquad (1)$$

where, $k_0$ is a constant, $n_1$ is a refractive index of a waveguide region, $n_2$ is a refractive index of a portion of the active region which is adjacent to the waveguide region.

To solve the above-described problem, the stripe width may be narrowed or $n_1^2 - n_2^2$ may be made small so as to be lower the normalized frequency V, thereby establishing a single lateral transVerse mode. However, if $n_1^2 - n_2^2$ is made small, a difference in the refractive indexes becomes small, and therefore the light becomes liable to be transmitted from the waveguide region to the active region, so that the degree of confinement of light drops. On the other hand, if the stripe width is narrowed, the photon density in the waveguide region becomes high, with the result that optical damage results.

In addition, the same also applies to a light amplifier which makes use of the gain waveguide mechanism or a gain waveguide type light amplifier, since the magnitude of the gain corresponds to the magnitude of the refractive index.

In the light amplifier of a single mode, the above-described multi-mode does occur. However, there are limits to obtaining a high output, so that it is impossible to obtain a very large output.

In addition, in a technique disclosed in "Progress in Semiconductor Laser Diodes (1986)", SPIE, Vol. 723, pp. 36–39, a technique is disclosed for obtaining a high output using a light amplifier having a large stripe width. However, since a slit disposed between two cylindrical lenses is used as a light isolator, part of a laser beam is shielded at an end portion of the slit, so that the incident laser beam which is projected into the light amplifier becomes a multi-mode. For this reason, this arrangement is unsuitable in a case where a high degree of resolution is required and a laser beam is condensed into a very narrow range with high power.

SUMMARY OF THE INVENTION

Accordingly, an object of the present invention is to provide a method of and an apparatus for projecting a laser beam into a light amplifier to generate a high output and high resolution laser beam from the light amplifier without any occurrence of optical damage so that the above-described drawbacks of the conventional art are overcome.

To this end, one aspect of the present invention is that it is characterized such that when a laser beam is projected into a light waveguide region of the light amplifier in which the light waveguide region is equal to or greater than a predetermined value, the laser beam which becomes an incident laser beam is projected after coincidence of intensity distribution of the laser beam with an electromagnetic field distribution in a fundamental mode of the light waveguide region.

Another aspect of the present invention is that, there is provided an apparatus for projecting the incident laser beam incident into the light amplifier in which a width of a light waveguide region is equal to or greater than a predetermined value. And, the apparatus is comprised by a laser beam source for outputting a laser beam in a fundamental mode; a collimator for making the laser beam parallel; a light isolator for propagating the laser beam from the laser beam source only in the direction of the light amplifier; a beam shaping device for shaping the laser beam in such a manner that the distribution of the incident laser beam into the light amplifier becomes identical with or approximate to the distribution of the fundamental mode of the light amplifier; and a light condensing element for condensing and projecting the shaped laser beam into the light amplifier.

The present invention is arranged such that, when the incident laser beam is projected into a light waveguide region of the light amplifier in which a stripe width of an active region is equal to or greater than a predetermined value, the incident laser beam is projected after the intensity distribution of the laser beam is made to coincide with the electromagnetic field distribution in the fundamental mode of the light waveguide region. In this fundamental mode, i.e. a lateral transverse mode of the smallest degree, the amplitude distribution of wave motion along a cross section perpendicular to an optical axis is expressed by a Gaussian function. Accordingly, the laser beam in which the intensity distribution has been adjusted to the electromagnetic field distribution of the fundamental mode becomes a single-crest Gaussian beam, and the Gaussian beam is projected into a semiconductor device or the light amplifier. As a result, propagation mode becomes only the fundamental mode, and an amplified Gaussian beam is emitted from the light amplifier. Accordingly, it is possible to make the laser beam emitted from the semiconductor device converge into a several-micron spot up to a diffraction limit in the Gaussian distribution. In addition, since the propagation mode becomes only the fundamental mode, it is possible to enlarge the stripe width. As a result, the efficiency of coupling with the incident laser beam can be enhanced, and thereby it is possible to attain a high output.

As described above, in accordance with the present invention, since the intensity distribution of the incident laser beam is made to coincide with the electromagnetic field distribution in a peculiar fundamental mode of a light waveguide region, there is an advantage in that it is possible to obtain a high output and high resolution laser beam.

The above and other objects, features and advantages of the present invention will become apparent from the following detailed description of the invention when read in conjunction with the accompanying drawings.

BRIEF DESCRIPTION OF THE DRAWINGS

FIGS. 1(A) and 1(B) are respectively a schematic top plan view and a schematic side elevational view of an embodiment of the present invention;

FIG. 1(C) is a schematic view showing a condition that a laser beam is carried out incident into a light waveguide region;

FIGS. 2(A) and 2(B) are respectively schematic cross-sectional views showing a broad contact-type light amplifier;

DESCRIPTION OF THE PREFERRED EMBODIMENTS

Figure 3:
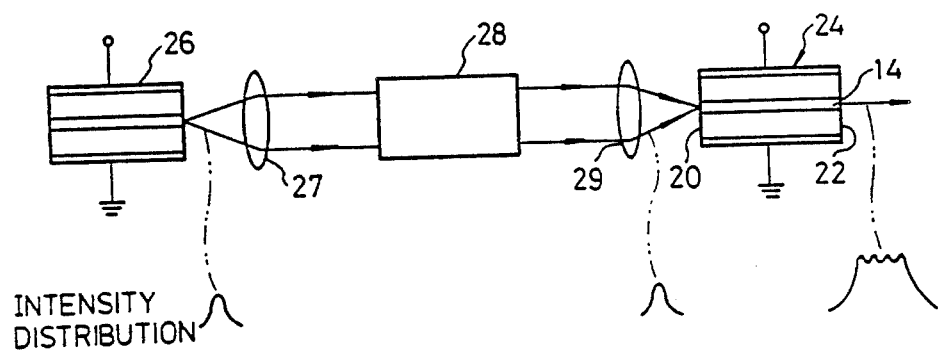
FIG. 3 is a schematic side elevational view showing a relationship of layout of a laser diode and a light amplifier in a conventional apparatus.
Figure 4:
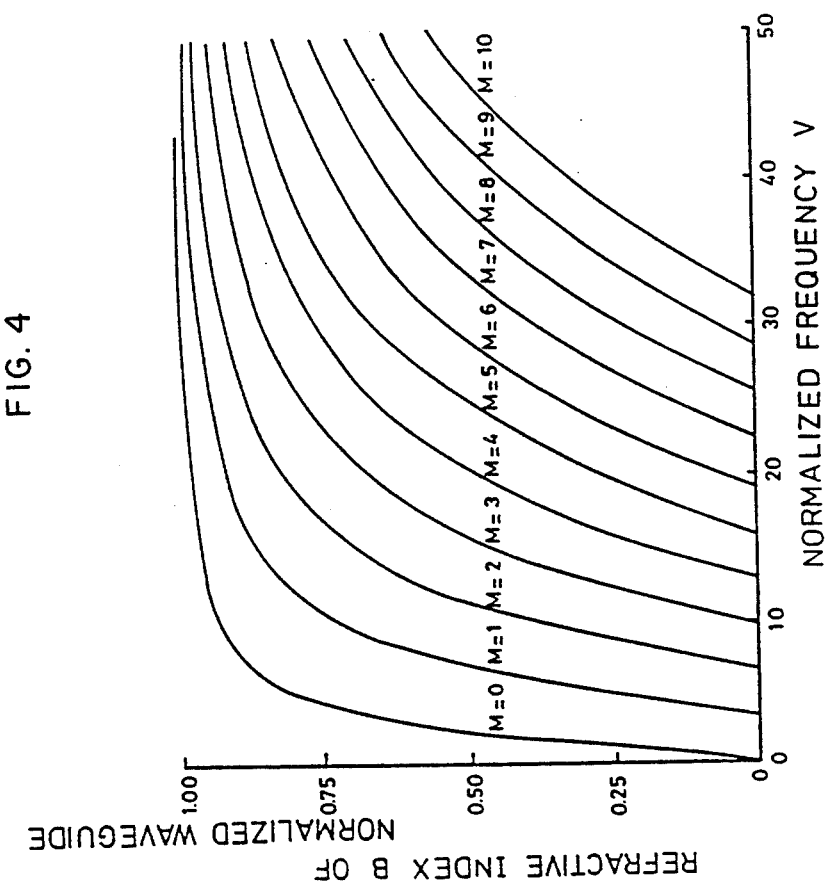
FIG. 4 is a diagrammatic view illustrating relationships between a normalized frequency V and a refractive index B of a normalized waveguide region.

FIGS. 1(A) and 1(B) are schematic views illustrating an embodiment of the present invention. An apparatus of the present invention has a laser diode 26 which oscillates in a single transverse mode. A collimator lens 30 and a light isolator 28 are disposed in that order on a laser beam-generating side of the laser diode 26. The light isolator 28 is provided with polarizers 34, 36 with a Faraday rotor 32 placed therebetween. The light isolator 28 is also provided with a plate 38 of $\lambda/2$ wavelength on a side of the polarizer 36. A cylindrical lens 40 with a focal length $f_1$, a cylindrical lens 42 with a focal length $f_2$, and a coupling lens 44 are arranged in that order on the laser beam incidence side of the light isolator 28. In addition, a light amplifier 24 which has a construction that is similar with one shown in FIGS. 2(A) and 2(B) and has 10 $\mu$m or more stripe width is disposed in such a manner that an incident portion thereof is located at a focusing position of the coupling lens 44.

A fundamental mode of the light amplifier 24 can be determined through calculations made separately by a refractive index waveguide light amplifier and a gain waveguide light amplifier, or by oscillating a laser diode having the same arrangement as that of the light amplifier and by spectral diffraction thereof excepting that a reflectance of its mirror surface is different.

For incidence of a laser beam whose intensity distribution coincides with an electromagnetic field distribution of the fundamental mode determined as described above into the light amplifier 24, the laser diode 26 whose fundamental mode coincides with the fundamental mode of the light amplifier 24 is used, or an incident laser beam of the fundamental mode is projected into the light amplifier 24 by adjusting an optical system which is comprised by the collimator lens 30, the light isolator 28, the cylindrical lens 40, the cylindrical lens 42, and the coupling lens 44.

Referring now to FIG. 1(B), a description will be given of a configuration of a section of the laser beam cut in a plane perpendicular to the optical axis as well as the distribution of light intensity (a pattern in a plane perpendicular to the active region). It should be noted that a description will be given by assuming a direction along the active region as being a lateral transverse direction and a direction perpendicular to the active region as being a perpendicular direction. In addition, the cross-sectional configuration and the distribution of light intensity which are shown in FIG. 1(B) have been modified to facilitate a visual understanding, and the actual configuration and distribution are not the same as those depicted in the drawings. For instance, there is a type in which a difference in intensity between a position immediately before the light amplifier and a position immediately after the light amplifier reaches as much as 100-fold.

The cross-sectional configuration of the laser beam in the vicinity of an emission surface of the laser diode 26 is a transversely elongated ellipse. The incident side of the colimator 30 has a perpendicularly elongated ellipse, and this configuration is the same in the case of the emission side of the collimator 30. On the incident side of the coupling lens 44, since the laser beam is condensed only in the transverse direction by the cylindrical lenses 42, 44, the configuration is an ellipse which is further shrunk in the transverse direction in proportion to the ellipse on the emission side of the collimator 30. The configuration in the vicinity of the focal point of the coupling lens 44 is a small ellipse which is elongated in the transverse direction. The length of this small ellipse in the transverse and perpendicular directions should preferably be made substantially equivalent to the configuration of an end surface of a light waveguide region 25 as shown in FIG. 1(C). With respect to the distribution of light intensity, a single crest or peak is noted in various portions, and a high-power laser beam with a single crest is obtained from the light amplifier 24.

Although, in the foregoing embodiment, a description has been given in accordance with an example in which the laser diode is used as the laser beam source, it is also possible to employ a laser beam transmitted through a transmission line such as an optical fiber by using a laser diode, a gas laser, a solid-state or the like. In addition, although a description has been given on the basis of an example in which a cylindrical lens is used as a beam shaping device, it suffices that it is an optical device which is capable of condensing the laser beam only in the transverse direction, and a prism or the like may alternatively be used.

In the above disclosed embodiment, since a spot of high output light condensed to two or three micron spot is obtained, it is preferable to use in a laser computer output microfilmer which carries out recording on a heat-mode recording material with a high resolution of 3,360 dots/7.2 mm or thereabout. In addition, it is possible to apply in a scanner which precisely reads out an image or in an optical disc or the light through which a great volume of information is stored.

What is claimed is:

1. A method of projecting an incident laser beam into a light amplifier, said laser beam being projected into a light waveguide region of said light amplifier in which a width of said light waveguide region is equal to or greater than a predetermined value, comprising the steps of:
   making the intensity distribution of said laser beam coincide with an electromagnetic field distribution in a fundamental mode of said light waveguide region; and
   subsequently projecting said laser beam into said light waveguide region.

2. A method of projecting an incident laser beam according to claim 1, wherein said intensity distribution of said laser beam is made to coincide with said electromagnetic field distribution by generating said laser beam by a laser diode which oscillates in a fundamental mode and by projecting said laser beam incidence through an optical system.

3. An apparatus for projecting an incident laser beam into a light amplifier in which a width of a light waveguide region is equal to or greater than a predetermined value, said apparatus comprising:
   a laser beam source for outputting a laser beam in a fundamental mode;
   a collimator for making said laser beam parallel;
   a light isolator for propagating said laser beam from said laser beam source only in the direction of said light amplifier;
   a beam shaping device for shaping said laser beam in such a manner that the distribution of said laser beam being projected into said light amplifier becomes identical with or approximate to the distribution of the fundamental mode of said light amplifier; and
   a light condensing element for condensing said shaped laser beam and for projecting the same into said light amplifier.

4. An apparatus according to claim 3, wherein said laser beam source is a laser diode which oscillates a laser beam in a fundamental mode.

5. An apparatus according to claim 4, wherein said laser diode and said light amplifier are disposed in such a manner that an active region of said laser diode and an active region of said light amplifier become parallel, and said beam shaping device is constituted by an optical system which condenses a laser beam in the direction in which said active regions extend.

6. An apparatus according to claim 5, wherein said optical system is one of a cylindrical lens and a prism disposed in such a manner so as to condense said laser beam in the direction in which said active regions extend.

7. An apparatus according to claim 5, wherein said light isolator includes a Faraday rotor, a pair of polarizers disposed on an incident side and an emission side of said Faraday rotor, and a plate of $\lambda/2$ wavelength disposed on said emission side of said emission side polarizer.

* * * * *